FIP8102 OR 3,114,107
SEARCH ROOM
X5261Y
[redacted]
OM
RSO 78
Dec. 10, 1963 J. L. WHISENHUNT 3,114,107
RADIO FREQUENCY TRANSMITTER
Filed Dec. 6, 1960
SUBSTITUTE FOR MISSING OR
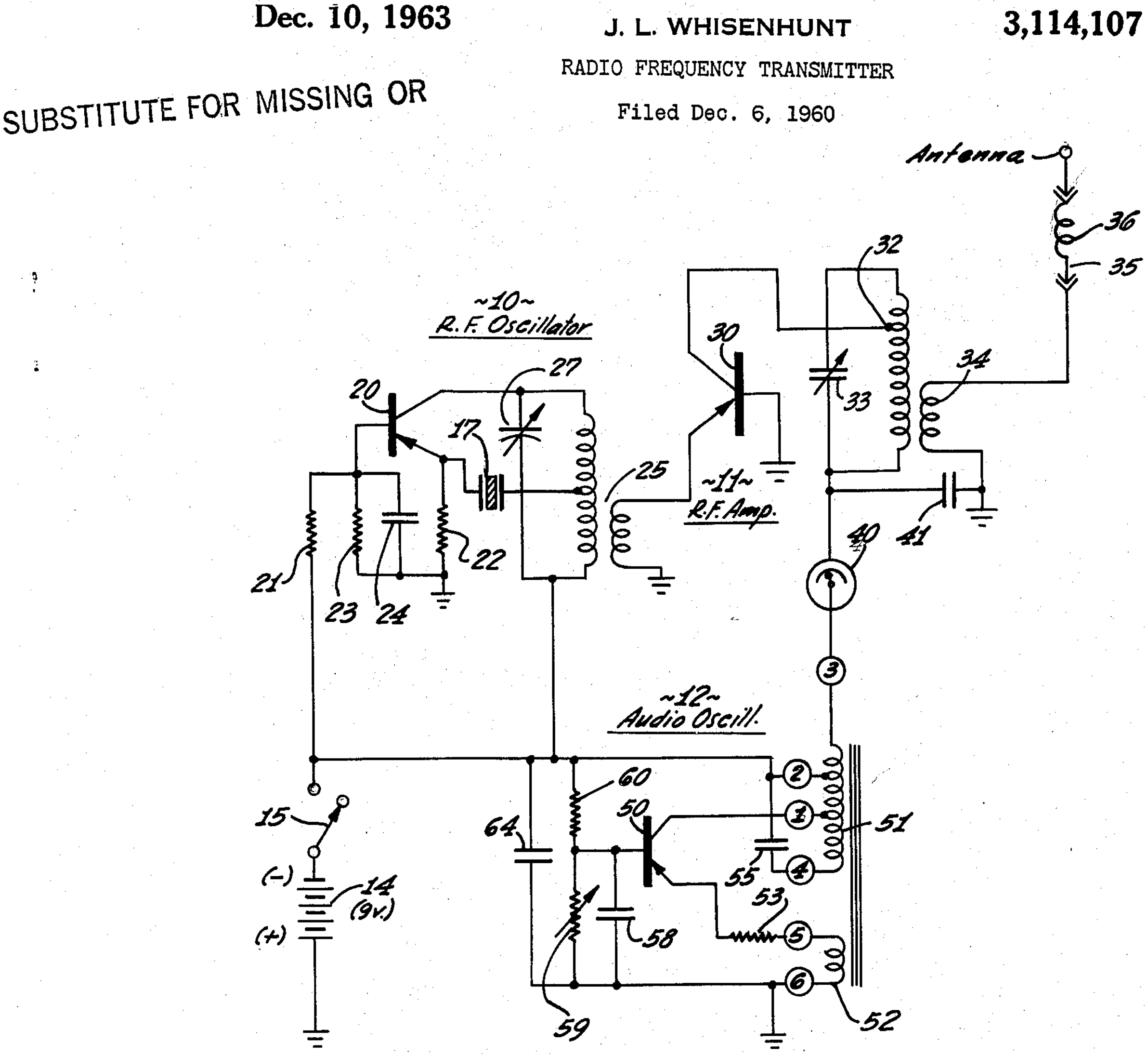
INVENTOR:
J. L. Whisenhunt
By Smyth, Roston & Pavitt
Attorneys.

United States Patent Office 3,114,107
Patented Dec. 10, 1963

3,114,107

RADIO FREQUENCY TRANSMITTER

J. L. Whisenhunt, Reseda, Calif., assignor to Packard-Bell Electronics Corporation, Los Angeles, Calif., a corporation of California Filed Dec. 6, 1960, Ser. No. 74,133
3 Claims. (Cl. 325—105)

This invention relates to transmitters and, more particularly, to transmitters for use in inexpensive remote control systems.

Competitive remote control systems utilize high frequency carriers modulated by bursts of audio frequency tones or signals. Such systems have application, for example, to remote controlled equipment such as model airplanes, trains, boats, garage doors, etc. In such competitive systems, the cost of the various components is, of course, an important aspect of the commercial success of the systems. In prior transmitters for such systems, a number of stages have been required including a radio frequency oscillator, an audio frequency oscillator, amplifiers and a modulator for modulating the audio frequency signal on the radio frequency carrier. These equipment requirements cause the transmitters to be relatively expensive.

In a specific illustrative embodiment of this invention, a separate modulator is not required and, moreover, a separate modulating transformer is not required. The elimination of such components materially reduces the cost of the remote control system which includes the transmitter. The transmitter includes an audio oscillator stage having an auto-transformer which forms part of the feedback path for the oscillator and which also serves to provide the audio frequency signal from the oscillator to a radio frequency output coil. The audio oscillator is also a power oscillator as the auto-transformer resonates at the audio frequency to provide for 100 percent modulation of the radio frequency signal at the output coil. The radio frequency signal is developed by a crystal oscillator coupled to the radio frequency output coil.

Features of this invention relate to introducing the audio frequency signal in series with the radio frequency output coil to provide for the 100 percent modulation of the radio frequency carrier. The audio frequency signal is provided through a D.C. meter which serves to decouple the radio frequency signal from the audio oscillator and to tune the crystal oscillator and the output coil for maximum signals.

Further features of this invention relate to means for readily changing the amplitude of the audio signal without varying its frequency and for giving the uniform audio amplitude with variations of component characteristics. The radio frequency output coil is inductively coupled to the antenna of the transmitter.

Further advantages and features of this invention will become apparent upon consideration of the following description when read in conjunction with the drawing wherein:

The single FIGURE is a circuit representation of the transmitter of this invention.

Referring to the single figure, a single source of potential 14, which may be a battery providing a potential of 9 volts, is utilized to energize the various components of the transmitter shown in the figure. The 9 volt potential is provided from the source 14 through a switch 15 to energize a radio frequency oscillator 10, a radio frequency amplifier 11, and an audio frequency oscillator 12 which together form the transmitter of this invention.

The oscillator 10 is a crystal controlled oscillator having a crystal 17 in the feedback path between the collector and emitter electrodes of a junction transistor 20. The grown diffused transistor 20 may illustratively be of the type R–425 manufactured by the Texas Instrument Company. The crystal 17 may be tuned, illustratively, to a frequency of 27 megacycles so that the oscillator 10 provides a 27 megacycle signal.

The transistor 20 is biased by a connection from the switch 15 through a base resistor 21 and the emitter is biased from ground through an emitter resistor 22. The resistor 21 may, illustratively, have a value of 27 kilohms and the resistor 22 may, illustratively, have a value of 270 ohms. The base electrode of the transistor 20 is also coupled to ground by a resistor 23 having a suitable value such as 4.7 kilohms and by a capacitor 24 having a suitable value such as 0.002 microfarad. The source 14 forward biases the transistor 20 causing it to become conductive and to couple a positive potential from its collector electrode through the primary winding of a transformer 25 to the crystal 17 which is coupled between a tap of the primary winding of the transformer 25 and the emitter electrode of the transformer 20. The primary winding of the transformer 25 is shunted by an adjustable capacitor 27 which is utilized to tune the transformer 25 so as to couple a maximum signal to a radio frequency amplifier 11. The capacitor 27 may have a suitable range such as 1 to 20 micromicrofarads. The lower junction of the capacitor 27 and the primary winding of the transformer 25 are connected by the switch 15 to the source 14.

The crystal oscillator 10 develops the 27 megacycle carrier signal and couples it to the emitter electrode of a junction transistor 30 in the radio frequency amplifier 11. The transistor 30 may be of the same type as the transistor 20. The base electrode of the transistor 30 is connected to ground and its collector electrode is connected to the junction of a radio frequency output coil 32. The coil 32 is shunted by an adjustable capacitor 33 which is utilized to tune the coil 32 so that a maximum signal is coupled through the coil 32 to a winding 34. The winding 34 forms part of an antenna 35, together with a loading coil 36. The adjustable capacitor 33 may have a range similar to that of the adjustable capacitor 27.

The two capacitors 27 and 33, one in the radio frequency oscillator 10, and the other across the coil 32, are adjusted to provide the maximum output signal utilizing a D.C. meter 40 which is connected to the coil 32. The junction between the coil 32 and the meter 40 is coupled to ground by a capacitor 41 which may have a value of .005 microfarad. The capacitor 41 serves to shunt the radio frequency signal provided toward the meter 40 to ground so that the meter 40 is effectively RF decoupled from the coil 32.

The meter 40 connects the coil 32 to the audio frequency oscillator 12, briefly mentioned above. The audio oscillator 12 includes a transistor 50 as its active element, which may be of the type designated R–456 manufactured by the Texas Instrument Company, and also an auto-transformer 51 which is connected to the meter 40. The oscillator 12 develops, illustratively, a 1,000 cycle tone utilizing the auto-transformer 51 as part of the feedback path together with a winding 52 between the collector and emitter electrodes of the grown diffused transistor 50. The emitter electrode of the transistor 50 is connected to the winding 52 by an emitter resistor 53 which may have a value of 27 ohms. The other terminal of the winding 52 is connected to ground. The auto-transformer 51 is resonated at the 1,000 cycle frequency due to a capacitor 55 which is coupled from one end of the auto-transformer at its terminal 4 to a terminal 2 adjacent to its other end. The capacitor 55 resonates the auto-transformer 51 to develop a substantially sinusoidal audio signal to the meter 40.

The following are illustrative values for the auto-transformer windings and the winding 52:

Terminals 3 to 4—.8 to 1.2 henries, 225 ohms D.C. max.;
Terminals 3 to 1—100 ohms, D.C. Max.;
Terminals 3 to 2—37 ohms D.C. max.; and
Winding 52—5 ohms D.C. max.

Illustrative turns ratios are as follows:

$$\frac{\text{Terminals 3 to 4}}{\text{Terminals 3 to 2}}=\frac{5}{1}$$

$$\frac{\text{Terminals 3 to 4}}{\text{Terminals 3 to 1}}=\frac{2}{1}$$

and $$\frac{\text{Terminals 3 to 4}}{\text{Winding 52}}=\frac{11-}{1}$$

The base electrode of the transistor 50 is connected to ground by a capacitor 58 which may have a value of 0.1 microfarad and the collector electrode is connected to terminal 1 of the auto-transformer 51. The capacitor 58 serves to provide for a substantially constant or uniform amplitude with variations of transistor characteristics. Further, the amplitude remains constant for different transistors. The base electrode is also connected to ground by a rheostat 59 which is utilized to adjust the amplitude of the signal delivered by the audio oscillator 12. The rheostat 59 may have a maximum resistance of 1.5 kilohms. The base electrode is biased over a path from the switch 15 through a resistor 60 which may have a value of 39 kilohms. The biasing potential at the base electrode may be +0.9 volt. The radio frequency signal at the oscillator 10 is shunted about the source 14 through a by-pass capacitor 64 which may have a value of 0.005 microfarad.

The oscillator 12 delivers a considerable amount of power, illustratively, 50 milliwatts to function as a combined power amplifier and oscillator so that a 100 percent modulation may be achieved of the radio frequency signal delivered from the RF amplifier 11. The power utilized by the transistor 30 may also be 100 milliwatts. The power amplification is achieved, in part, by resonating the auto-transformer 51. The capacitor 55, accordingly, serves both to provide the sinusoidal wave shape and to enhance the power provided to the meter 40.

The sinusoidal audio signal is provided from across the terminals 2 and 3 of the auto-transformer 51 to the D.C. meter 40. As indicated above, the meter 40 is utilized when the capacitors 27 and 33 are adjusted. The inductance of the meter 40 serves as part of the RF signal decoupling circuitry together with the capacitor 41, and the resistance of the meter 40 serves as part of the serial arrangement together with the coil 32 to provide for the modulation. The resistance of the meter 40 forms the serial arrangement with the coil 32 so that the signal across the coil is modulated by the audio frequency. More particularly, the biasing circuit for the collector of the transistor 30 is from the source 14 through the switch 15, the portion of the auto-transformer 51 between its terminals 2 and 3, the meter 40 and the lower portion of the coil 32. The bias to the collector electrode is varied by the audio frequency signal generated between the terminls 2 and 3 of the auto-transformer 51. The amplifier 11, coil 32 and meter 40, accordingly, function together as a modulated radio frequency amplifier. The transformer 51 and amplifier 12 function together as a modulator.

Although this invention has been disclosed and illustrated with reference to particular applications, the principles involved are susceptible of numerous other applications which will be apparent to persons skilled in the art. The invention is, therefore, to be limited only as indicated by the scope of the appended claims.

I claim:

1. A radio transmitter having a crystal RF oscillator for generating a constant frequency RF signal, a RF amplifier coupled to said oscillator and including a first transistor having three electrodes, a biasing path connected to each of said three electrodes, and a RF output coil connected to one of said three electrodes; said biasing circuit for said one electrode including a portion of said output coil; an antenna coupled to said output coil, an audio frequency oscillator for providing an audio frequency modulating signal and including an auto-transformer coupled to said output coil for introducing the modulating signal to said output coil, a second transistor having three electrodes, a biasing circuit connected to each of said three electrodes of said second transistor, one of said electrodes of said second transistor being connected to said auto-transformer so that at least a portion of said auto-transformer is included in the biasing circuit connected to said one electrode of said second transistor, RF decoupling means connected between said output coil and said auto-transformer for preventing the introduction of the RF signal to said auto-transformer, a source of biasing potential connected to said auto-transformer whereby said biasing circuit for said one electrode of said first transistor includes said source, a portion of said auto-transformer, said RF decoupling means, said portion of said output coil, said decoupling means including a D.C. meter having both inductance and resistance and said audio frequency oscillator also including a capacitor connected across a portion of the auto-transformer for resonating said auto-transformer at the audio frequency.

2. A radio transmitter having a RF oscillator for generating an RF signal, a RF amplifier coupled to said RF oscillator for amplifying said RF signals, a tuned circuit coupled to said amplifier which is tuned to the frequency of said RF oscillator, and an audio frequency oscillator for providing an audio frequency modulating signal, coupling means connected between said audio frequency oscillator and said tuned circuit and including a resistive element for introducing the audio frequency in series with the signal across the tuned circuit whereby said RF signal at said tuned circuit is modulated by the audio frequency signal, and a meter constituting the element in the coupling means and the meter being provided with an inductive reactance to inhibit the transfer of energy from the tuning circuit to the audio oscillator.

3. A radio transmitter having a crystal RF oscillator for generating a constant frequency RF signal, a RF amplifier coupled to said oscillator and including a first transistor having three electrodes, a biasing path connected to each of said three electrodes, and a RF output coil connected to one of said three electrodes; said biasing circuit for said one electrode including a portion of said output coil; an antenna coupled to said output coil, an audio frequency oscillator for providing an audio frequency modulating signal and including an auto-transformer coupled to said output coil for introducing the modulating signal to said output coil; RF decoupling means connected between said output coil and said auto-transformer for preventing the introduction of the RF signal to said auto-transformer, a source of biasing potential connected to said auto-transformer whereby said biasing circuit for said one electrode of said first transistor includes said source, a portion of said auto-transformer, said RF decoupling means, said portion of said output coil, and the decoupling means including a meter having resistive and inductive components to inhibit the introduction of the RF signal to the auto-transformer.

References Cited in the file of this patent

UNITED STATES PATENTS

| | | |
|---|---|---|
| 2,238,236 | Terman | Apr. 15, 1941 |
| 2,441,955 | Coxey | May 25, 1948 |
| 2,644,925 | Koros | July 7, 1953 |
| 2,853,615 | Kircher | Sept. 23, 1958 |
| 2,855,568 | Lin | Oct. 7, 1958 |
| 2,900,608 | Carroll et al. | Aug. 18, 1959 |
| 2,955,197 | Bryan | Oct. 4, 1960 |